(12) United States Patent
Furuta et al.

(10) Patent No.: US 11,262,212 B2
(45) Date of Patent: Mar. 1, 2022

(54) VIBRATION TYPE GYROSCOPE

(71) Applicant: DENSO CORPORATION, Kariya (JP)

(72) Inventors: Yoshikazu Furuta, Kariya (JP);
Nobuaki Matsudaira, Kariya (JP);
Tomohiro Nezuka, Kariya (JP)

(73) Assignee: DENSO CORPORATION, Kariya (JP)

( * ) Notice: Subject to any disclaimer, the term of this patent is extended or adjusted under 35 U.S.C. 154(b) by 539 days.

(21) Appl. No.: 16/362,045

(22) Filed: Mar. 22, 2019

(65) Prior Publication Data
US 2019/0310106 A1 Oct. 10, 2019

(30) Foreign Application Priority Data

Apr. 6, 2018 (JP) .............................. JP2018-073832

(51) Int. Cl.
*G01C 19/567* (2012.01)
*G01C 25/00* (2006.01)

(52) U.S. Cl.
CPC ........... *G01C 25/00* (2013.01); *G01C 19/567* (2013.01); *B81B 2201/0242* (2013.01)

(58) Field of Classification Search
CPC .. G01C 25/00; G01C 19/567; G01C 19/5776; B81B 2201/0242
See application file for complete search history.

(56) References Cited

U.S. PATENT DOCUMENTS

| | | | | |
|---|---|---|---|---|
| 5,889,193 A * | 3/1999 | Pfaff | .................... | G01C 25/005 73/1.37 |
| 6,062,082 A * | 5/2000 | Guenther | ........... | G01C 19/5712 73/504.03 |
| 6,553,833 B1 * | 4/2003 | Funk | .................. | G01C 19/5712 73/504.08 |
| 9,574,902 B2 * | 2/2017 | Okon | ................... | G01C 25/005 |
| 9,575,089 B1 | 2/2017 | Cazzaniga et al. | | |
| 9,702,898 B1 * | 7/2017 | Lipka | ................. | G01C 19/5776 |
| 2005/0283330 A1 * | 12/2005 | Laraia | .................... | G01C 25/00 702/104 |
| 2006/0174684 A1 | 8/2006 | Betz et al. | | |
| 2006/0260382 A1 | 11/2006 | Fell et al. | | |
| 2007/0177316 A1 * | 8/2007 | Hotelling | ............... | G01C 25/00 361/51 |
| 2007/0240486 A1 * | 10/2007 | Moore | ................... | G01C 21/16 73/1.37 |

(Continued)

FOREIGN PATENT DOCUMENTS

| | | |
|---|---|---|
| JP | 2008-082924 A | 4/2008 |
| JP | 2012-080320 A | 4/2012 |

*Primary Examiner* — David J Bolduc

(74) *Attorney, Agent, or Firm* — Posz Law Group, PLC

(57) ABSTRACT

A gyroscope includes a MEMS sensor having a drive signal input terminal, a drive signal output terminal, and a sense signal output terminal. The gyroscope further includes a quadrature demodulator that demodulates a modulated sense signal and offset canceller circuits that cancel a direct current offset component included in an in-phase signal and a quadrature signal of the sense signal. The gyroscope has a quadrature error detector that detects a quadrature error based on the signals input from the offset canceller circuits and outputs an error signal. The gyroscope also has an IQ corrector circuit that receives the in-phase signal and the quadrature signal of the sense signal as inputs, and outputs a phase signal with a phase based on the error signal.

11 Claims, 13 Drawing Sheets

(56) References Cited

U.S. PATENT DOCUMENTS

| | | | |
|---|---|---|---|
| 2010/0132463 A1* | 6/2010 | Caminada | G01C 19/56 73/504.12 |
| 2010/0294039 A1* | 11/2010 | Geen | G01C 19/5776 73/504.12 |
| 2011/0017868 A1 | 1/2011 | Arthurs et al. | |
| 2011/0192226 A1* | 8/2011 | Hayner | G01C 19/5776 73/504.12 |
| 2012/0096942 A1* | 4/2012 | Hayashi | G01C 19/5776 73/504.12 |
| 2012/0146740 A1* | 6/2012 | Furuta | H04B 1/0475 332/144 |
| 2013/0031950 A1* | 2/2013 | Donadel | G01C 19/5776 73/1.77 |
| 2013/0152664 A1 | 6/2013 | Pyo | |
| 2013/0199294 A1* | 8/2013 | Townsend | G01C 19/5677 73/504.13 |
| 2013/0268228 A1* | 10/2013 | Opris | G01C 25/00 702/104 |
| 2013/0269413 A1* | 10/2013 | Tao | B81B 7/008 73/1.38 |
| 2014/0260619 A1* | 9/2014 | Shaeffer | G01C 19/5776 73/528 |
| 2014/0373595 A1* | 12/2014 | Glueck | G01C 25/005 73/1.38 |
| 2015/0057959 A1 | 2/2015 | Ezekwe | |
| 2015/0128699 A1* | 5/2015 | Maki | G01C 19/5776 73/504.02 |
| 2015/0160632 A1* | 6/2015 | Buhmann | G01C 19/5776 700/275 |
| 2015/0276406 A1* | 10/2015 | Rastegar | G01C 19/5712 73/504.12 |
| 2015/0276407 A1* | 10/2015 | Bhandari | G01C 19/5776 73/504.12 |
| 2016/0018243 A1* | 1/2016 | Okon | G01C 19/5776 73/1.77 |
| 2016/0109258 A1* | 4/2016 | Boser | G01C 19/5726 73/504.12 |
| 2016/0161256 A1* | 6/2016 | Lee | H03L 7/087 73/504.12 |
| 2016/0187136 A1 | 6/2016 | Murakami et al. | |
| 2016/0231112 A1* | 8/2016 | Stewart | G01C 19/5677 |
| 2016/0277011 A1* | 9/2016 | Gil | H03K 5/135 |
| 2016/0327393 A1* | 11/2016 | Shaeffer | G01P 1/04 |
| 2017/0023364 A1* | 1/2017 | Gregory | G01P 15/13 |
| 2017/0167875 A1* | 6/2017 | Bhandari | B81B 7/02 |
| 2017/0307374 A1* | 10/2017 | Hughes | G01C 19/5712 |
| 2017/0322029 A1* | 11/2017 | Townsend | H03L 7/0991 |
| 2017/0328712 A1* | 11/2017 | Collin | H03D 7/00 |
| 2017/0350722 A1* | 12/2017 | Senkal | G01C 19/5614 |
| 2018/0017385 A1* | 1/2018 | Shirvani | G01C 19/56 |
| 2018/0058854 A1* | 3/2018 | Suzuki | G01C 19/5726 |
| 2018/0245946 A1* | 8/2018 | Weinberg | G01C 19/5684 |
| 2018/0259359 A1* | 9/2018 | Mansfield | G01C 19/5755 |
| 2018/0274924 A1* | 9/2018 | Mecchia | G01C 19/5776 |
| 2018/0274941 A1* | 9/2018 | Quartiroli | G01C 19/5776 |
| 2019/0120657 A1* | 4/2019 | Senkal | G01R 23/005 |
| 2019/0145773 A1* | 5/2019 | Collin | G01C 19/5776 73/504.12 |
| 2019/0186950 A1* | 6/2019 | Dakshinamurthy | B81B 7/02 |
| 2019/0265036 A1* | 8/2019 | Arndt | G01D 5/24 |
| 2020/0400433 A1* | 12/2020 | Aaltonen | G01C 19/5776 |

* cited by examiner

VIBRATION TYPE GYROSCOPE

CROSS REFERENCE TO RELATED APPLICATION

The present application is based on and claims the benefit of priority of Japanese Patent Application No. 2018-073832, filed on Apr. 6, 2018, the disclosure of which is incorporated herein by reference.

TECHNICAL FIELD

The present disclosure relates to a vibrating structure or vibration type gyroscope.

BACKGROUND INFORMATION

Microelectromechanical (MEMS) devices such as MEMS resonators may be used as components in vibration-type ("vibration type") gyroscopes due to the availability and cost of MEMS resonators. However, such MEMS devices may be prone to accuracy issues due to manufacturing errors. As such, vibration type gyroscopes are subject to improvement.

SUMMARY

The present disclosure describes a vibration type gyroscope that can dynamically perform a highly accurate phase correction of signals during signal processing.

BRIEF DESCRIPTION OF THE DRAWINGS

Objects, features, and advantages of the present disclosure will become more apparent from the following detailed description made with reference to the accompanying drawings, in which.

DETAILED DESCRIPTION

Microelectromechanical systems (MEMS) or MEMS devices such as MEMS resonators may be used in vibrating structure type gyroscopes due the relative wide availability and low cost of MEMS resonators. However, MEMS resonators may be prone to manufacturing error and as a result cause accuracy issues in the gyroscope (e.g., sensor values, output values).

Figure 16:
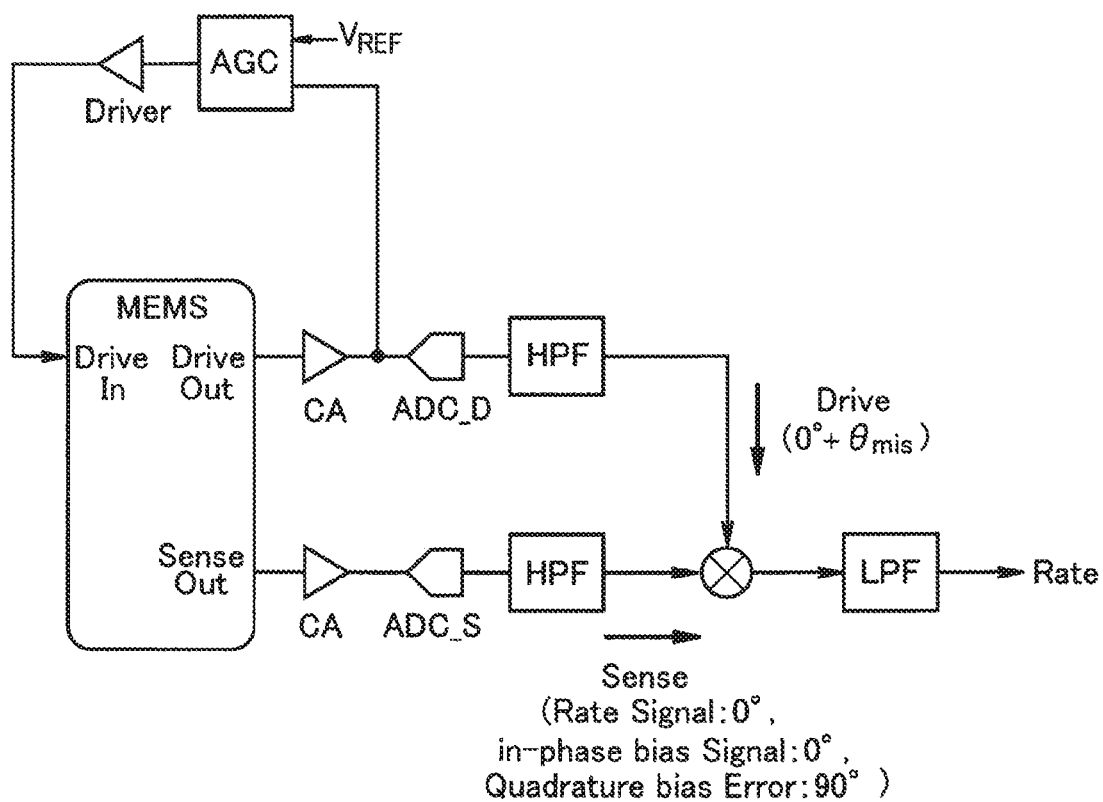
FIG. 16 illustrates a configuration of a vibration type gyroscope.

FIG. 16 shows a general configuration of a vibration type gyroscope. Here, an example of the Open Loop Architecture is shown with a MEMS component (i.e., MEMS resonator or "sensor") having an input terminal "Drive In" for inputting an input drive signal, an output terminal "Drive Out" for outputting an output drive signal, and an output terminal "Sense Out" for outputting a sensor or "sense" signal.

An input drive signal may provide a drive voltage to the MEMS resonator at the Drive In terminal. When the drive voltage is applied to the MEMS resonator, the MEMS resonator vibrates/oscillates along its drive axis. The oscillation of the MEMS resonator causes a displacement of the MEMS resonator along the drive axis, and such a displacement causes an electric current in the output drive signal at the "Drive Out" terminal. Such an electric current can be used to detect and measure the displacement of the MEMS resonator during oscillation.

A drive axis oscillation loop is formed from the Drive Out terminal and loops to the Drive In terminal of the MEMS resonator. The drive axis oscillation loop can be used to control the frequency and amplitude of the MEMS resonator displacement along the drive axis direction so that the MEMS resonator displacement is driven with the same frequency and amplitude.

When an angular velocity is applied to the MEMS resonator in a direction perpendicular to the drive axis and sense axis, a displacement that is proportional to the Coriolis force and having the same frequency as the input drive signal is generated along the sense axis. Such a displacement also causes an electric current that is output at the Sense Out terminal. As such, the sense signal is an amplitude modulated (AM) signal proportional to the Coriolis force with a carrier frequency that is the same as the input drive signal frequency.

The drive axis oscillation loop includes a charge amplifier (CA), a phase locked loop (PLL) (not shown), and an automatic gain control (AGC) circuit. Since an angular velocity signal "Rate" in the sense signal is generated by the Coriolis force and subjected to amplitude modulation (AM) by a resonance frequency, the value of the angular velocity signal Rate can be derived by using a synchronously detected output drive signal and by cancelling the harmonic frequency component using a low-pass filter (LPF).

Figure 17:
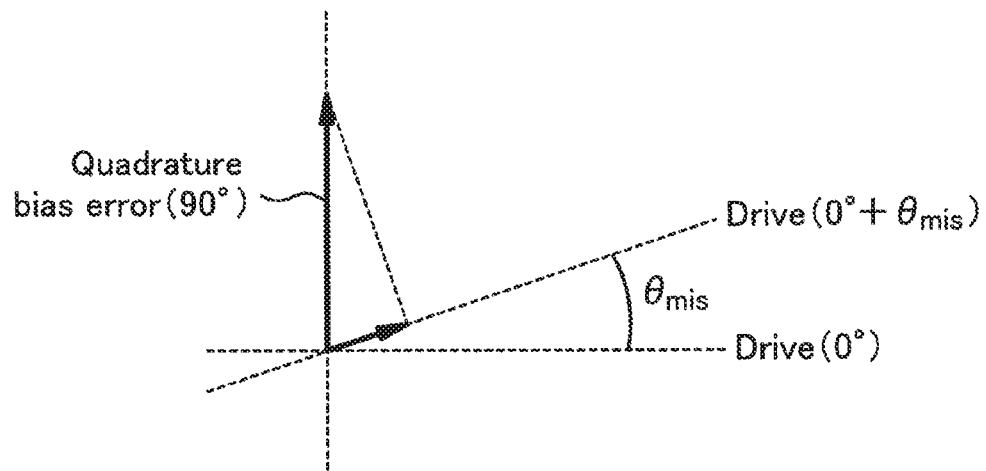
FIG. 17 is illustrates a quadrature error.
Figure 18:
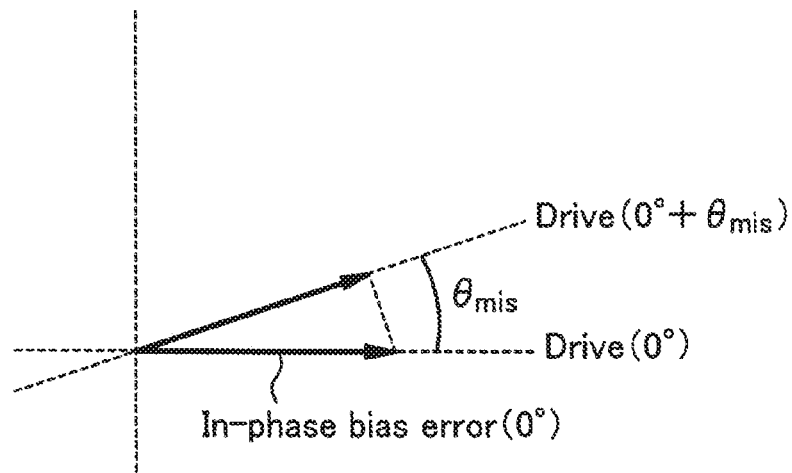
FIG. 18 illustrates an in-phase error.

The sense signal output from the Sense Out terminal normally includes a Quadrature Bias Error (QBE) and an In-phase Bias Error (IBE), in addition to the angular velocity signal, due to manufacturing errors in the MEMS resonator. Since a quadrature bias error signal is orthogonal to the angular velocity signal, the quadrature bias error signal can be eliminated by synchronously detecting the sense signal with the drive signal. In reality, however, as shown in FIG. 17, a vector component corresponding to a quadrature phase error θmis of the drive signal and the sense signal generated by the MEMS mixes into the sensor (i.e., MEMS resonator) output as an error component. Similarly, as shown in FIG. 18, the in-phase bias error also mixes into the sensor output as an error component. Since these error components are larger in amplitude than the angular velocity signal, even if the phase difference is small, these error components may have a significant effect on the accuracy of the MEMS resonator and thus the gyroscope using such a MEMS resonator.

In order to solve such a problem, the phase difference θmis may be corrected to zero. For example, there are methods of correcting the errors by calibrating the gyroscope at a reference temperature T0, which uses a quadrature phase error empirically identified during the manufacturing and/or the calibration of the gyroscope, by using a vector operation.

However, by using such a method, it is necessary to specify and obtain the correction information in advance. In other words, in instances where no configuration information is available and/or element characteristics of the gyroscope fluctuate due to aging, a high-accuracy phase correction cannot be performed. Such calibration may also be time consuming when shipping the gyroscopes/MEMS resonators from the factory, which leads to an increase in manufacturing costs.

A vibration type gyroscope in one aspect of the present disclosure may use a resonator that includes a drive signal input terminal, a drive signal output terminal, and a sense signal output terminal for outputting a modulated sense signal corresponding to an externally-applied angular velocity as modulated by a drive signal. A quadrature demodulator may quadratically demodulate the modulated sense signal, and first and second offset canceller circuits may respectively cancel a direct current (DC) offset component included in an in-phase signal and a quadrature signal of the sense signal.

An error detector may detect a quadrature error based on a signal input from the first and second offset canceller circuits, and output an error signal. A phase corrector may receive an input of the in-phase signal and the quadrature signal of the sense signal, and output a phase signal having a corresponding phase to the error signal.

If a quadrature phase error emir exists in the drive signal and the sense signal, the in-phase error and the quadrature error can be eliminated by cancelling the DC offset component from the demodulated signal, since the in-phase error and the quadrature error are included in the quadratically-demodulated signal as DC offset components in an angular velocity signal, which is an alternating current (AC) component. Then, by using the error-cancelled in-phase and quadrature signals, the quadrature phase error θmis can be calculated. Consequently, by outputting the phase signal having the corresponding phase to the error signal based on the in-phase signal and the quadrature signal of the sense signal, the phase corrector can dynamically perform the phase correction for eliminating the influence of the in-phase error and the quadrature error, and is capable of more accurately detecting the angular velocity.

Other embodiments described herein may reduce rounding errors and minimize the finite word length effects of digital processing, so that the phase correction can performed with an even higher accuracy.

Figure 5:
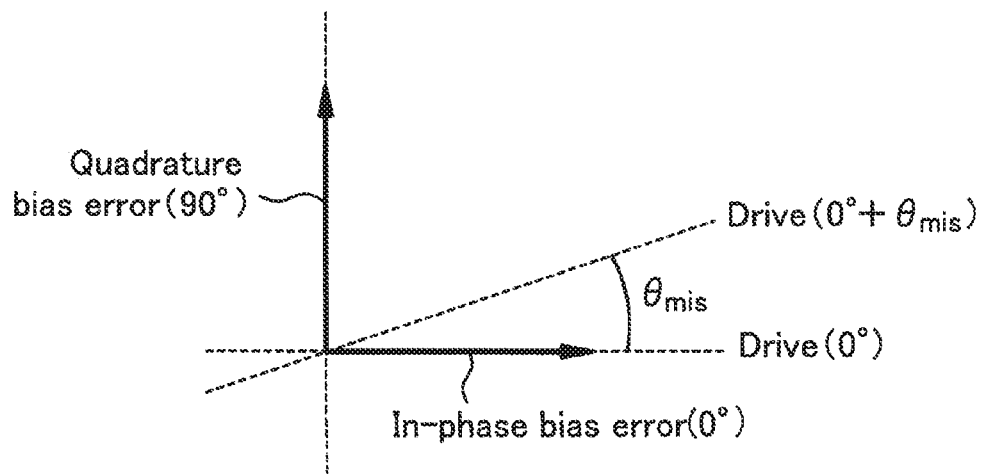
FIG. 5 illustrates an in-phase bias error (IBE) signal and a quadrature bias error (QBE) signal.

Prior to the description of the vibration type gyroscope 1, the principle of phase correction is described. The principle of phase correction in the present embodiment assumes for the in-phase bias error (IBE) signal and the quadrature bias error (QBE) signal that "ω" is the drive axis vibration frequency and "$A_R \exp(j\omega t)$" is the rate signal based on an angular velocity, where the IBE signal and QBE signal may be defined as:

IBE signal: $A_{IB} \exp(j\omega t)$
QBE signal: $A_{QB} \exp(j\omega t + j\tau/2)$ FIG. 5 shows a phase relationship between the IBE signal and the QBE signal and an amount of quadrature phase error θmis.

A modulated rate signal "Smod" that is output from a sense axis is represented by equation (1).

$$S \bmod = A_R \exp(j\omega t) + A_{IB} \exp(j\omega t) + A_{QB} \exp(j\omega t + j\tau/2) \quad \text{Equation (1)}$$

When the quadrature phase error θmis exists in the drive signal and in the sense signal, the quadratically-demodulated signals Isig and Qsig are represented by equations (2) and (3).

$$I\text{sig} = A_R \cos \theta\text{mis} + (A_{IB} \cos \theta\text{mis} - A_{QB} \sin \theta\text{mis}) \quad \text{Equation (2)}$$

$$Q\text{sig} = A_R \sin \theta\text{mis} + (A_{IB} \sin \theta\text{mis} + A_{QB} \cos \theta\text{mis}) \quad \text{Equation (3)}$$

Figure 6:
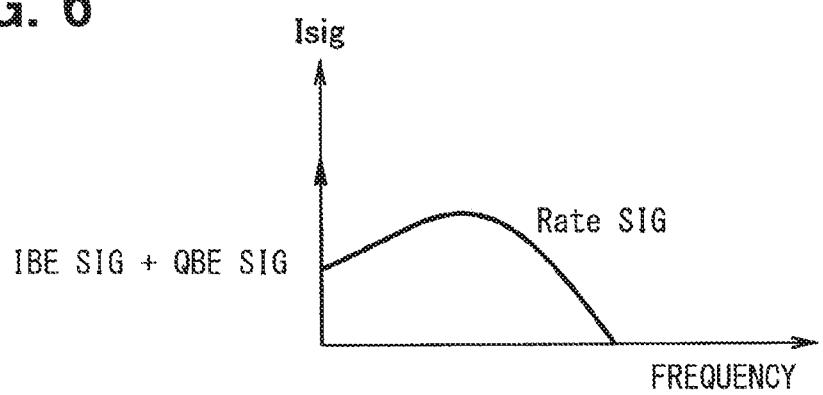
FIG. 6 illustrates a relationship between an in-phase signal Isig and an angular velocity signal Rate.
Figure 7:
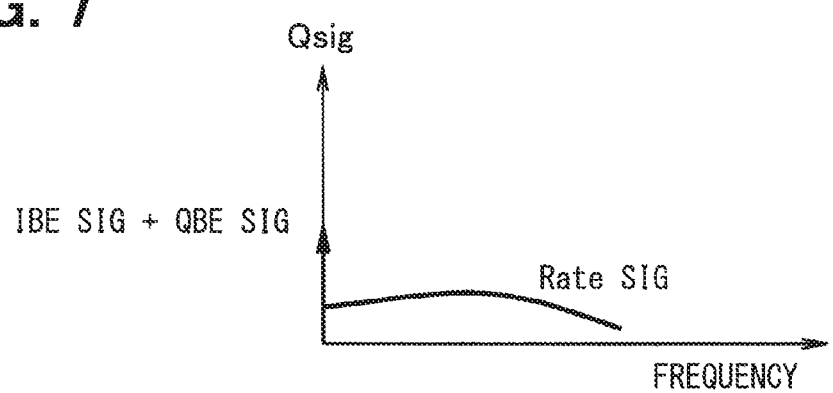
FIG. 7 illustrates a relationship between a quadrature signal Qsig and the angular velocity signal Rate.

In equations (2) and (3), the $A_R \cos \theta$mis and $A_R \sin \theta$mis signal components are alternating current (AC) components, and the IBE and QBE signal components, i.e., ($A_{IB} \cos \theta$mis$-A_{QB} \sin \theta$mis) and ($A_{IB} \sin \theta$mis$+A_{QB} \cos \theta$mis), are direct current (DC) components. FIG. 6 shows an in-phase signal Isig that includes the IBE and QBE DC components, and FIG. 7 shows a quadrature signal Qsig that includes the IBE and QBE DC components.

The in-phase signal Isig_dcoc and the quadrature signal Qsig_dcoc are represented by equations (4) and (5) after cancelling the DC offset from the in-phase signal Isig and the quadrature signal Qsig.

$$I\text{sig\_dcoc} = A_R \cos \theta\text{mis Equation} \quad (4)$$

$$Q\text{sig\_dcoc} = A_R \sin \theta\text{mis Equation} \quad (5)$$

Equations (4) and (5) are information that includes quadrature errors. The amount of the quadrature phase error θmis can be calculated from equation (6) using equations (4) and (5).

$$\theta\text{mis} = \tan^{-1}(Q\text{sig\_dcoc}/I\text{sig\_dcoc}) \quad \text{Equation (6)}$$

When the level of the Rate signal detected by a signal detector exceeds a threshold value for a preset period of time, the amount of the quadrature phase error θmis can be calculated by equation (6). By correcting the sense signal by an angle $\phi = -\theta$mis using an I signal and a Q signal, the quadrature error can be corrected by equation (7).

$$I\text{cal} = I\text{sig} \cdot \cos \phi - Q\text{sig} \cdot \sin \phi \quad \text{Equation (7)}$$

The above calculations limit and/or eliminate the influence of the IBE signal and the QBE signal so that the angular velocity can be more accurately detected.

First Embodiment

Figure 1:
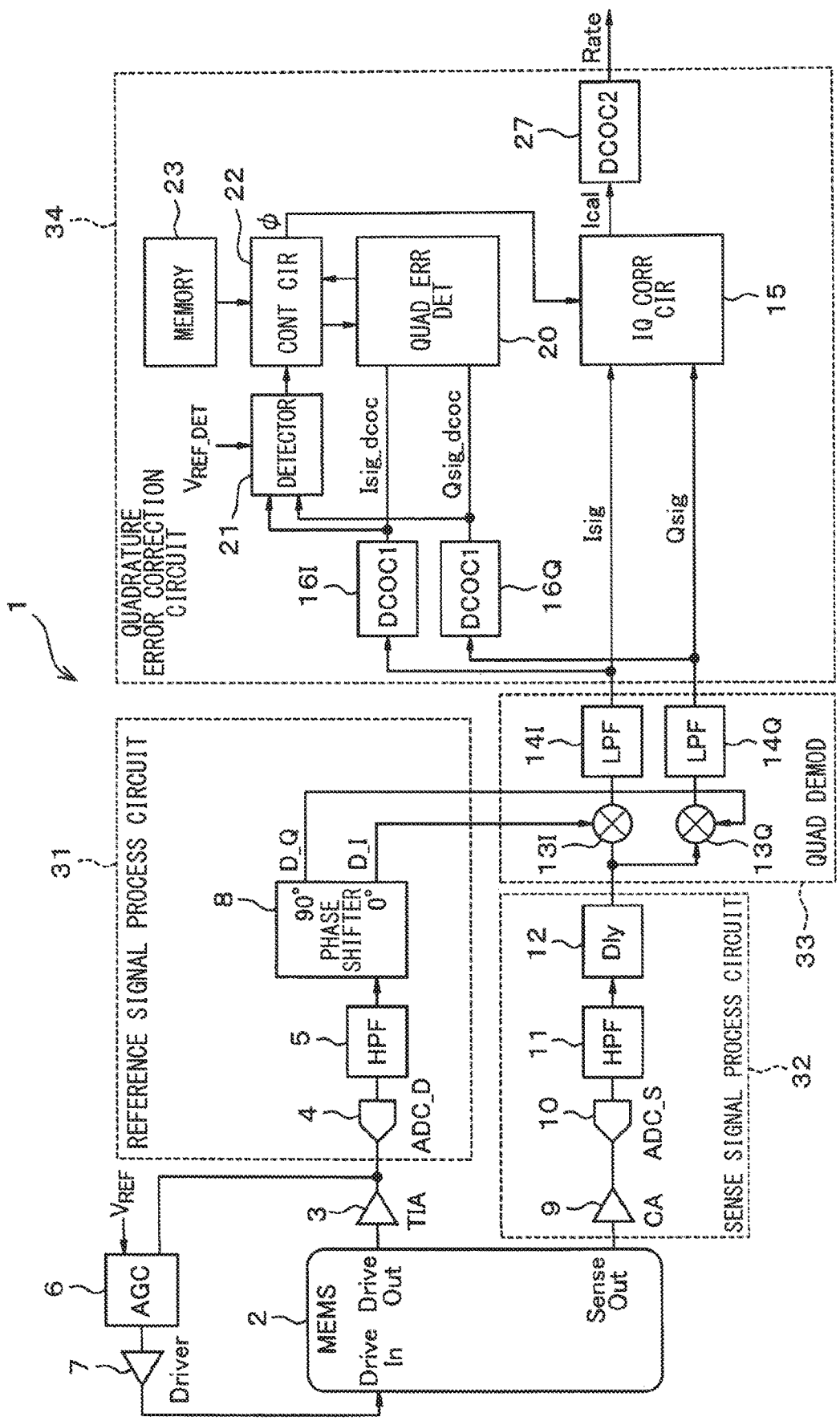
FIG. 1 illustrates a configuration of a vibration type gyroscope in a first embodiment of the present disclosure.

FIG. 1 illustrates a schematic diagram of a vibration type gyroscope 1. The vibration type gyroscope 1 may also be referred to as a vibratory gyroscope 1 or a vibrating structure gyroscope 1. The vibration type gyroscope 1 of the present embodiment includes a microelectromechanical system (MEMS) sensor 2 that is configured as a MEMS resonator. The MEMS sensor 2 may also be referred to as a MEMS resonator 2, or more simply a resonator 2. The MEMS sensor 2 has a drive input terminal "Drive In" for inputting a drive signal, a drive output terminal "Drive Out" for outputting drive signal, and a sense signal output terminal "Sense Out" for outputting a sense signal.

The vibration type gyroscope 1 further includes a reference signal process circuit 31, a sense signal process circuit 32, a quadrature demodulator 33, and a quadrature error correction circuit 34.

An impedance conversion amplifier 3 (i.e., a transimpedance amplifier (TIA) 3) is connected to the Drive Out output terminal. The TIA 3 converts the change of electrostatic capacitance in the MEMS sensor 2 to a voltage value. The voltage value converted by the TIA 3 is further converted to digital data by an A/D converter "ADC_D" 4 in the reference signal process circuit 31. The digital data is then input to a high-pass filter (HPF) 5.

The output voltage of the TIA 3 (i.e., the converted voltage value) is a drive signal having a resonance frequency Fd of the MEMS sensor 2. In addition to being input into the A/D converter 4, the converted voltage value is also input to an automatic gain control (AGC) circuit 6.

The output signal of the AGO circuit 6 is input to the Drive In input terminal of the MEMS sensor 2 via a driver 7. When the gyroscope 1 begins operation, the AGC circuit 6 compares an amplitude of a reference voltage "VRef" with an amplitude of the converted voltage from the TIA 3, and then performs a gain control based on the comparison result to stabilize the amplitude of the converted voltage from the TIA 3. By doing such, the amplitude of the drive signal can be maintained. The above description describes an oscillation loop of the drive axis of the MEMS sensor 2. The resonance frequency Fd is, for example, roughly 10 kHz to 20 kHz.

The phase of the data output by the HPF 5 is shifted by 90 degrees by the phase shifter 8. The phase shifter 8 may include, for example, a Hilbert transformer circuit, by which a quadrature signal D_Q is generated. The phase shifter 8 also gives the output data by the HPF 5 a time delay equal to the time used to perform the above-described phase shift, and outputs the time-delayed signal as an in-phase signal D_I.

When the angular velocity is applied to the MEMS sensor 2 in a state where the oscillation loop of the drive axis is operating and the oscillation of the drive signal is in a steady state after the gyroscope 1 begins to operate, the application of the Coriolis force causes an AM modulated sense signal to be output from the output terminal Sense Out. The sense signal is modulated by the frequency of the drive signal that is input at the Drive In terminal of the MEMS sensor 2.

When the modulated sense signal is output from the sense signal output of the MEMS sensor 2, the modulated sense signal is input to a sense signal process circuit 32, where the signal passes through a charge amplifier (CA) 9, an analog-to-digital converter ADC_S 10, a high-pass filter (HPF) 11, and a delay (Dly) circuit 12.

The Dly circuit 12 sets a delay time that takes both the delay in the phase shifter 8 and a fixed offset delay from the Sense Out output terminal into consideration. That is, the delay may take into consideration the same delay time as the one given to the in-phase signal inside the phase shifter 8 and a fixed offset delay time from the output terminal Sense Out of the MEMS sensor 2 to the sense signal process circuit 32. The fixed offset delay time can be set by a microcontroller or like processing device by a preset or fixed delay time stored in memory. After passing through the Dly circuit 12, the processed modulated sense signal is input to the quadrature demodulator 33.

The quadrature demodulator 33 includes multipliers (i.e., mixers) 13I and 13Q, and low-pass filters (LPF) 14I and 14Q. The in-phase signal D_I and the quadrature signal D_Q from the phase shifter 8 are input respectively to the mixers 13I and 13Q of the quadrature demodulator 33. The mixers 13I and 13Q perform synchronous detection (i.e., demodulation) by respectively multiplying the modulated sense signal by the in-phase signal D_I and the quadrature signal D_Q. The detected signal (i.e., the modulated sense signal that has been multiplied by the in-phase signal and quadrature signal) is then quadratically demodulated by the LPFs 14I and 14Q and output as a sense signal.

From the quadrature demodulator 33, the sense signal is input to the quadrature error correction circuit 34. In the quadrature error correction circuit, as shown in FIG. 1, the in-phase signal Isig and the quadrature signal Qsig components of the sense signal are represented by equations (2) and (3), as described above, and are input to an IQ correction circuit 15. The in-phase signal Isig and quadrature signal Qsig are also input to first offset canceller circuit 16I and second offset canceller circuit 16Q, i.e., to DC Offset Cancel circuits (DCOC1) 16I and 16Q in the drawings.

Figure 2:
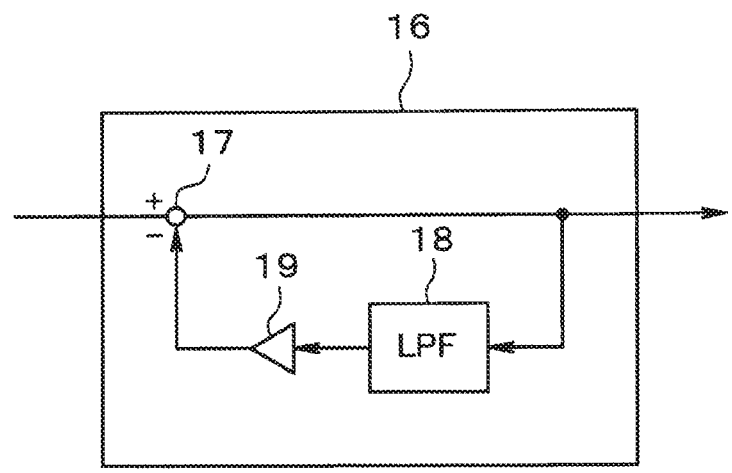
FIG. 2 illustrates a configuration of a direct current oscillation cancel (DCOC) circuit.

The first and second offset canceller circuits 16I and 16Q are described in greater detail with reference to FIG. 2, and illustrated by a singular DC Offset Cancel circuit (DCOC) circuit 16. That is, the configuration of DCOC 16 is used to described the configurations of both DCOC1 16I and 16Q in FIG. 1. The DCOC 16 includes a subtractor 17, an low-pass filter (LPF) 18, and a buffer 19. The signal output from the DCOC 16 has high-pass filter characteristics with a time constant of the data update period in the LPF 18. The DCOC1 circuits 16I and 16Q respectively eliminate the DC offset component in the in-phase signal Isig and the quadrature signal Qsig inputs, and respectively output the Isig_dcoc and Qsig_dcoc signals. The in-phase signal with canceled DC offset (i.e., Isig_dcoc) is represented by equation (4), and the quadrature signal with canceled DC offset (i.e., Qsig_dcoc) is represented by equation (5).

Figure 4:
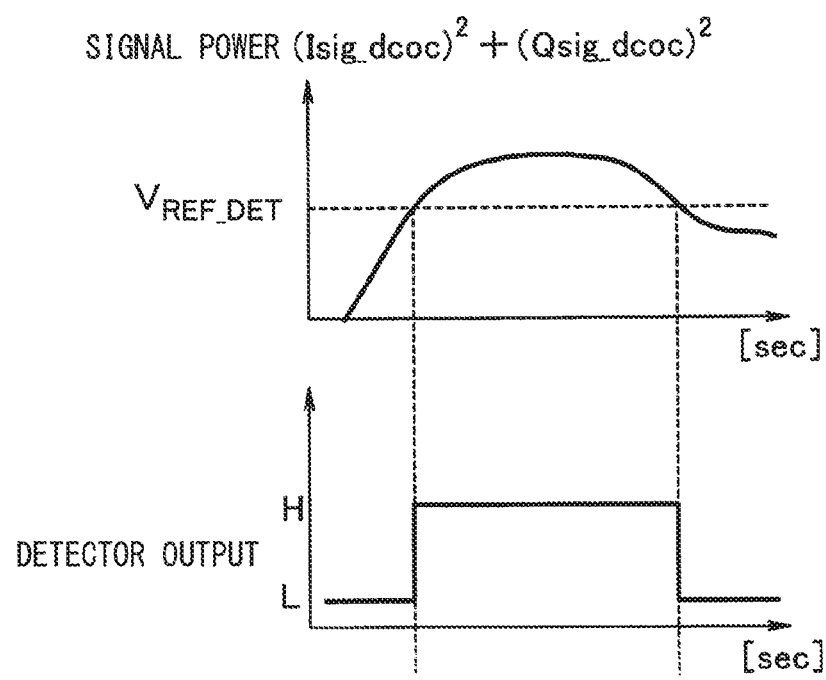
FIG. 4 illustrates an operation of a detector.

The signals Isig_dcoc and Qsig_dcoc are then input to both a quadrature error detector 20 and to a detector 21. The quadrature error detector 20 calculates the quadrature phase error θmis by equation (6), and outputs the quadrature phase error θmis to a control circuit 22. The quadrature error detector 20 may also be referred to simply as the error detector 20. The detector 21 calculates a signal power. Signal power, as shown in FIG. 4, is the sum of the squares of the Isig_dcoc and the Qsig_dcoc signal. The detector 21 thus calculates the signal power by summing the squares of the Isig_dcoc and Qsig_dcoc signals, compares the calculated signal power with a threshold value $V_{REF\_DET}$, and outputs a signal. The signal output by the detector 21 may be a high level "H" or low level "L" signal. When the signal power exceeds the threshold value $V_{REF\_DET}$, the detector 21 outputs a high level "H" signal to the control circuit 22. An example threshold value $V_{REF\_DET}$ is also illustrated in FIG. 4 along with the detector output to show how the level of the output from the detector 21 changes when the signal power exceeds the threshold value $V_{REF\_DET}$.

The control circuit 22 may be a digital circuit such as, for example, a microcontroller, a field-programmable gate array (FPGA), and a sequencer, and the control circuit 22 is configured to calculate an average value. A memory 23 is connected to the control circuit 22. The memory can store an amount of the quadrature error correction ϕ as an initial value. The control circuit 22 reads the initial value stored in the memory 23 immediately after the gyroscope 1 begins operating, and outputs the initial value to the IQ correction circuit 15. Thereafter, when the detector 21 outputs a high-level "H" output signal, i.e., a trigger signal, the control circuit 22 performs an averaging process of the quadrature phase error θmis for a preset period of time. In other words, the control circuit 22 is configured to calculate the average of a plurality of error signals that are input from the error detector 20 for a preset period of time in response to receiving the trigger signal. As such, the control circuit 22 may also be referred to as the average calculator 22. The stored average value is then set as the quadrature error correction amount ϕ at a preset interval (i.e., ϕ=−θmis). The quadrature error correction amount ϕ is then output to the IQ correction circuit 15.

Figure 3:
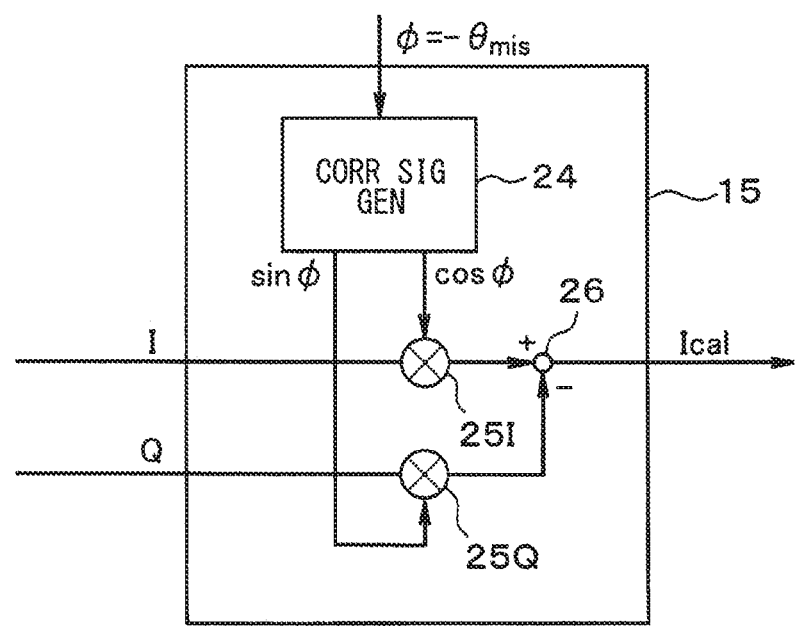
FIG. 3 illustrates a configuration of an IQ correction circuit.

As shown in FIG. 3, the IQ correction circuit 15 includes a correction signal generator 24, multipliers 25I and 25Q, and a subtractor 26. The IQ correction circuit 15 may also be referred to more simply as a phase corrector 15. The correction signal generator 24 respectively outputs a sine signal sin ϕ and a cosine signal cos ϕ to the multipliers 25Q and 25I. The multiplier 25I multiplies the in-phase signal Isig with the cosine signal cos ϕ, and the multiplier 25Q multiplies the quadrature signal Qsig with the sine signal sin ϕ. The subtractor 26 subtracts the output of the multiplier 25Q from the output of the multiplier 25I, and outputs the difference as a correction signal Ical, as shown by equation (7).

The correction signal generator 24 may include, for example, a microcontroller or a digital signal processing (DSP) circuit (not shown). Alternatively, a table with the sine and cosine values for each angle ϕ may be prepared in advance and stored in memory or a register, and, when an angle ϕ is input, a corresponding sin and/or cos value to the angle ϕ may be read from the table and output.

The DC offset component included in the correction signal Ical is cancelled by a DC offset correction circuit (DCOC2) 27 disposed on an output side of the IQ correction circuit 15, and the DCOC2 outputs the value of the angular velocity signal Rate from the quadrature error correction circuit 34. While the DCOC1 16I may be referred to as the first offset canceller circuit 16I, and the DCOC1 16Q may be referred to as the second offset canceller circuit 16Q, the DCOC2 27 may be referred to as the third offset canceller circuit 27.

The gyroscope 1 as a whole may be composed of application-specific integrated circuits (ASICs) or like hardware. For example, each of the reference signal processing circuit 31, the sense signal processing circuit 32, the quadrature demodulator 33, and the quadrature error correction circuit 34 and/or their internal components may each be realized as one or more ASICs specifically configured to perform the processing, functions, and calculations associated with each of these circuits, as described above.

As described above, according to the present embodiment, the gyroscope 1 includes the MEMS sensor 2 including the input terminal Drive In, the output terminal Drive Out, and the output terminal Sense Out. The quadrature demodulator 33 quadratically demodulates the modulated sense signal, and the offset canceller circuits (DCOC1) 16I and 16Q respectively cancel the direct current offset component included in the in-phase signal and the quadrature signal of the sense signal. The quadrature error detector 20 detects the quadrature error θmis based on the signals input from the offset canceller circuits (DCOC1) 16I and 16Q, and outputs the error signal. The IQ correction circuit 15 receives the in-phase signal Isig and the quadrature signal Qsig of the sense signal as inputs, and outputs the phase signal Ical having the phase ϕ based on the error signal.

The phase shifter 8 generates the in-phase signal of the drive signal and the quadrature signal of the drive signal, where the quadrature signal of the drive signal has a phase difference of 90 degrees from the in-phase signal of the drive signal. The quadrature demodulator 33 multiplies the modulated sense signal by the in-phase signal and the quadrature signal of the drive signal to demodulate the sense signal. The demodulated in-phase signal and the demodulated quadrature signal of the sense signal are input both to the offset canceller circuits 16I and 16Q and to the IQ correction circuit 15, and the offset canceller circuit (DCOC2) 27 cancels the DC offset component included in the phase signal Ical that is output from the IQ correction circuit 15, and outputs the angular velocity signal Rate. By using the above-described configuration, the angular velocity can be made highly accurate and better detectable by dynamically performing the phase correction to eliminate the influence of the in-phase error IBE and the quadrature error QBE.

Second Embodiment

In the description of the current embodiment, like features and elements from the previous embodiment may be used and be denoted by the same reference numbers used in the description of the previous embodiment. As such, a repeat description of the like features and elements from the previous embodiment may be omitted in the description of the current embodiment. The description of the current embodiment focuses on the differences between the current embodiment and the previous embodiment.

Figure 8:
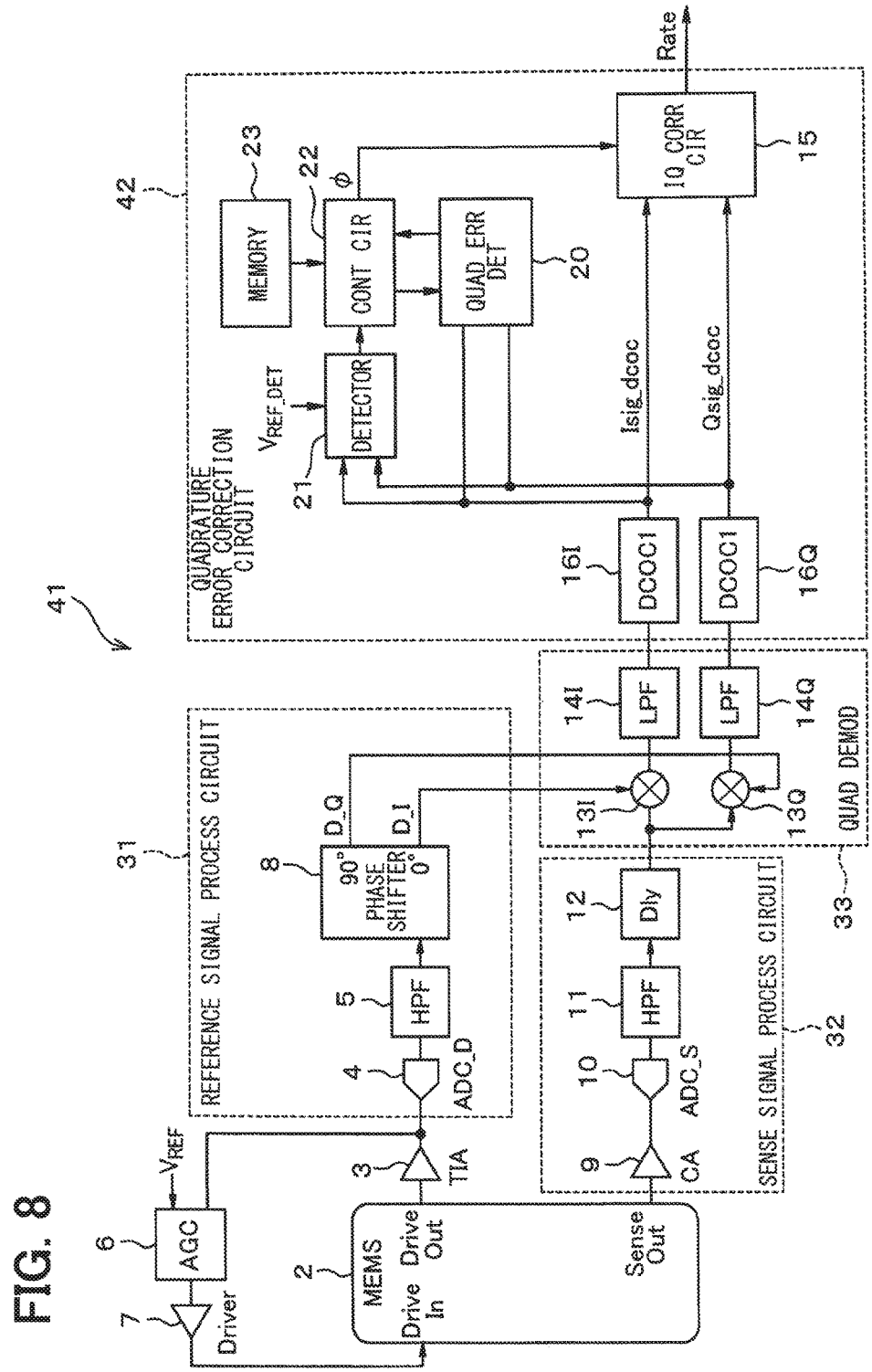
FIG. 8 illustrates a configuration of a vibration type gyroscope in a second embodiment of the present disclosure.

As shown in FIG. 8, a gyroscope 41 of the second embodiment has a quadrature error correction circuit 42, which replaces the quadrature error correction circuit 34 in the first embodiment. The quadrature error correction circuit 42 inputs the in-phase signal Isig_dcoc and the quadrature signal Qsig_dcoc from the offset canceller circuits DCOC1 circuits 16I and 16Q to the IQ correction circuit 15, instead of inputting the in-phase signal Isig and the quadrature signal Qsig. Accordingly, the DCOC circuit 27 of the first embodiment can be dispensed from the current embodiment, and the angular velocity signal Rate is output from the quadrature error correction circuit 42 via the IQ correction circuit 15.

According to the second embodiment configured as described above, since the in-phase signal Isig_dcoc and the quadrature signal Qsig_dcoc are input to the IQ correction circuit 15 with the DC offset component already having been cancelled, the DCOC2 circuit 27 from the first embodiment may be eliminated from the current embodiment to reduce the overall area and number of parts of the quadrature error correction circuit 42, and to reduce the overall size of and simplify the gyroscope 41.

Third Embodiment

Figure 9:
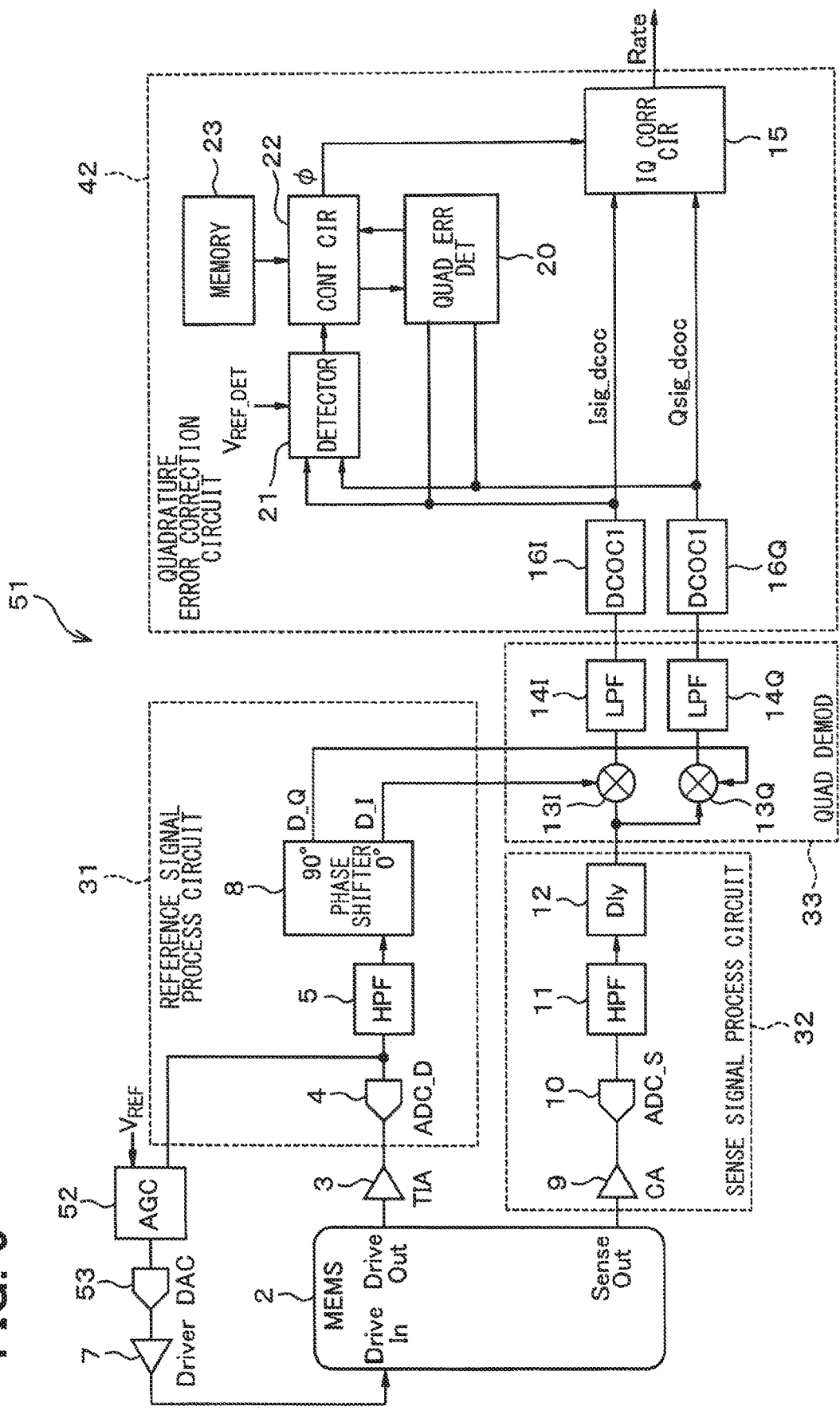
FIG. 9 illustrates a configuration of a vibration type gyroscope in a third embodiment of the present disclosure.

As shown in FIG. 9, a gyroscope 51 of the third embodiment may be configured similarly to the gyroscope 41 of the second embodiment, where the drive axis oscillation loop is configured differently than the drive axis oscillation loop of the second embodiment. In the present embodiment, an automatic gain control (AGC) circuit 52 can be configured as a digital circuit to replace the AGC circuit 6 of the previous embodiments. The AGC circuit 52 may also be referred to as the gain controller circuit 52. The input terminal of the AGC circuit 52 is connected to the output terminal of the analog-to-digital converter (ADC_D) 4. The output terminal of the AGC circuit 52 is connected to the input terminal of the driver 7 via a digital-to-analog converter (DAC) 53.

The analog AGC circuit 6 of the previous embodiments may use a filter for compensating a phase margin that may cause a tradeoff between the gain control stability and the high-speed pull-in. On the other hand, if the AGC circuit 52 is configured as the digital circuit described in the third embodiment, the phase compensation filter may have more flexibility in its design. Consequently, the drive-axis oscillation loop with the digital AGC 52 in the present embodiment can have both increased stability and high-speed pull-in without having to sacrifice one for the other.

Fourth Embodiment

Figure 10:
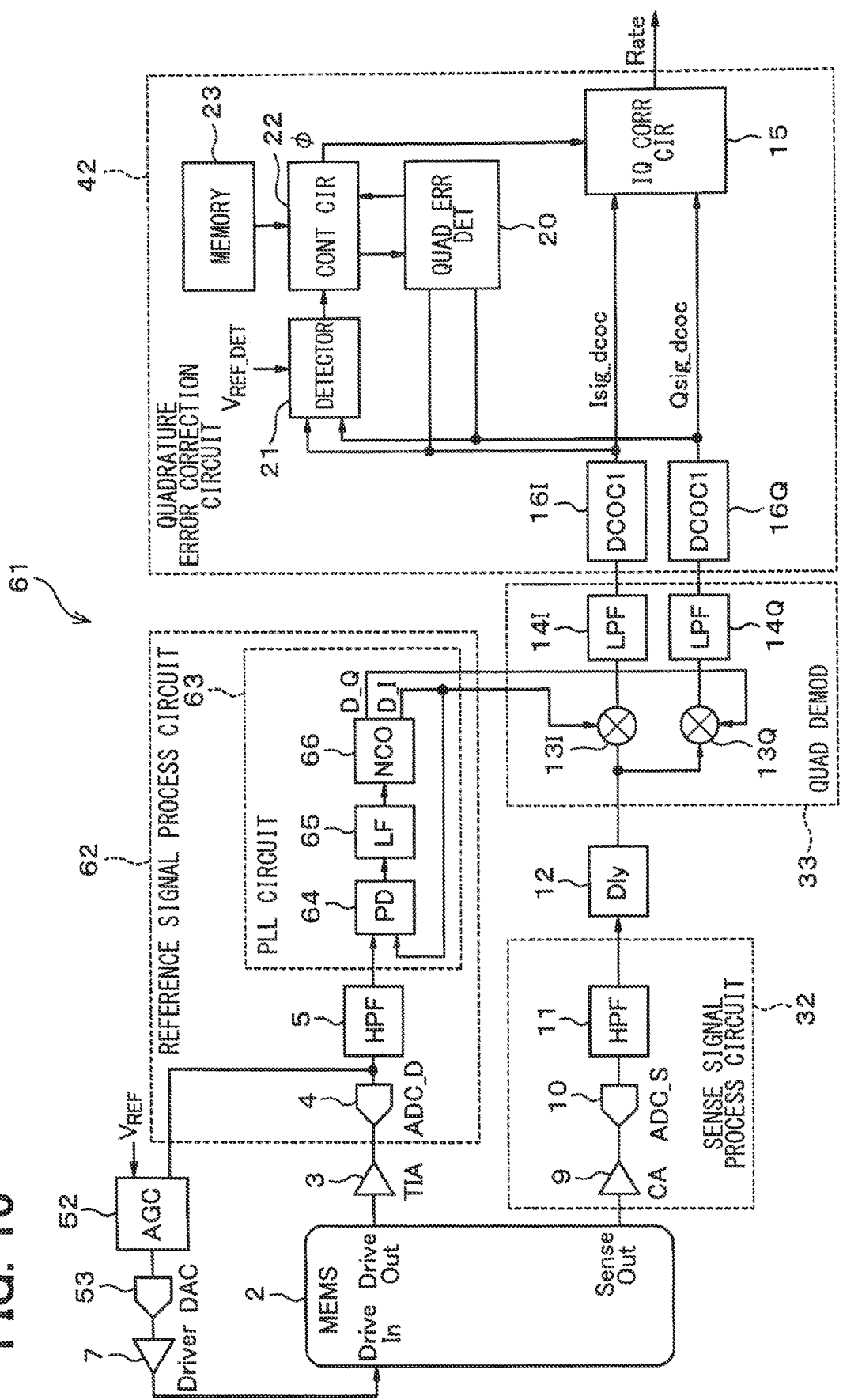
FIG. 10 illustrates a configuration of a vibration type gyroscope in a fourth embodiment of the present disclosure.

As shown in FIG. 10, a gyroscope 61 of the fourth embodiment may be configured similarly to the gyroscope 51 in the previous embodiment, where the reference signal processing circuit 31 of the third embodiment is replaced with a reference signal processing circuit 62. In the present embodiment, the reference signal process circuit 62 uses a Phase Locked Loop (PLL) circuit 63 in place of the phase shifter 8. The PLL circuit 63 includes a phase detector (PD) 64, a loop filter (LF) 65, and a numerically-controlled oscillator (NCO) 66. The in-phase signal D_I and the quadrature signal D_Q are output from the NCO 66 to the quadrature demodulator 33.

By using the above-described configuration, the noise in the drive signal can be reduced/limited by the LF 65 in the PLL circuit 63. Consequently, the gyroscope 61 in the fourth embodiment can reduce signal noise and thus has low-noise characteristics.

Fifth Embodiment

Figure 11:
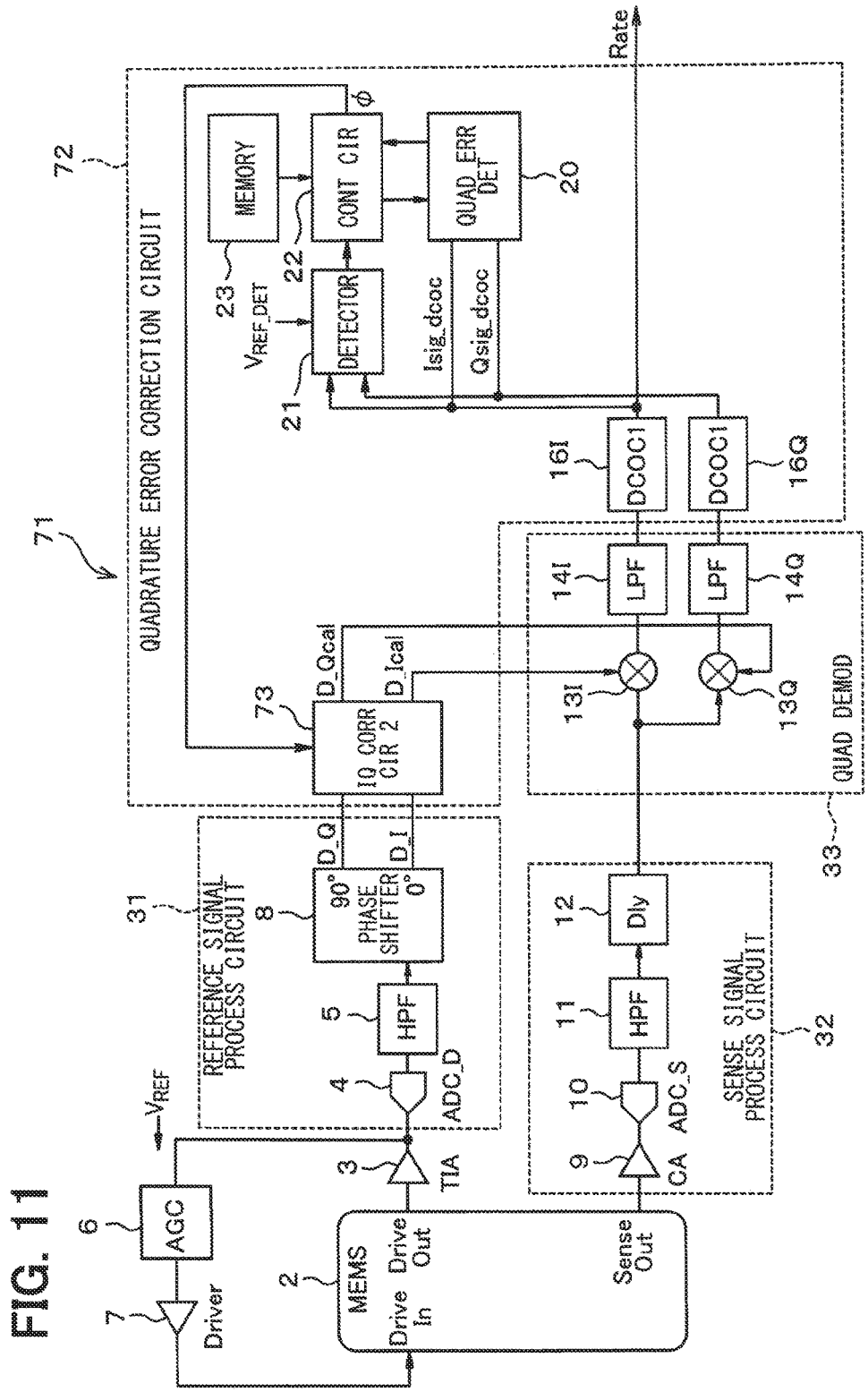
FIG. 11 illustrates a configuration of a vibration type gyroscope in a fifth embodiment of the present disclosure.

As shown in FIG. 11, a gyroscope 71 of the fifth embodiment is configured similarly to the gyroscope 41 the second embodiment. In the fifth embodiment, the quadrature error correction circuit 42 of the second embodiment is replaced with a quadrature error correction circuit 72. The quadrature error correction circuit 72 has an IQ correction circuit 73 labeled as "IQ CORR CIR 2" in FIG. 11. The in-phase signal D_I and the quadrature signal D_Q from the phase shifter 8 are input to the quadrature error correction circuit 72. The IQ correction circuit 73 in the fifth embodiment replaces the IQ correction circuit 15 in the second embodiment. The IQ correction circuit 73 may also be referred to more simply as the phase corrector 73. The IQ correction circuit 73 corrects the phase of the in-phase signal D_I and the quadrature signal D_Q by the quadrature error correction amount φ that is input from the control circuit 22, and outputs the signal D_Ical and the quadrature signal D_Qcal to the quadrature demodulator 33 after the phase correction. In addition, the angular velocity signal Rate is output from the quadrature error correction circuit 72 by the DCOC1 circuit 16I.

Figure 12:
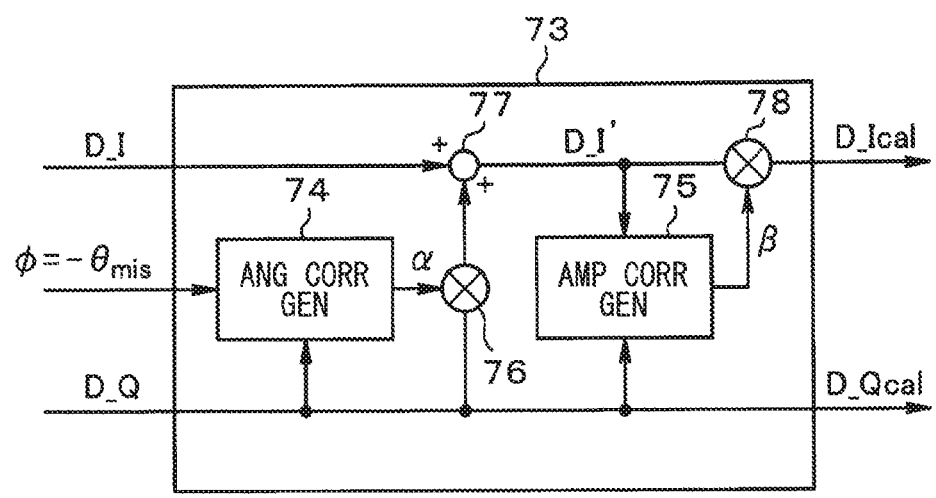
FIG. 12 illustrates a configuration of an IQ correction circuit.

As shown in FIG. 12, the IQ correction circuit 73 includes an angle correction generator 74, an amplitude correction generator 75, multipliers 76 and 78, and an adder 77. The in-phase signal D_I is input to the adder 77. The quadrature signal D_Q is input to the angle correction generator 74, to the amplitude correction generator 75, and to the multiplier 76. The quadrature error correction amount φ is input to the angle correction generator 74.

Figure 13:
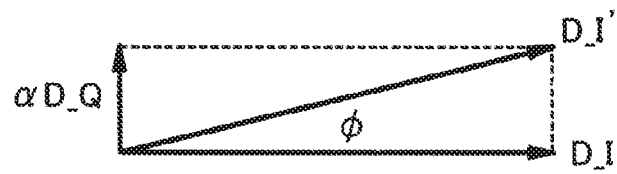
FIG. 13 illustrates a principle of angle correction in the IQ correction circuit.

FIG. 13 shows the principle of the angle correction by the IQ correction circuit 73. The angle correction generator 74 generates an angle correction coefficient α from the quadrature error correction amount φ and the quadrature signal D_Q, and outputs the angle correction coefficient α to the multiplier 76. In the adder 77, the angle correction is performed by a vector operation that adds the multiplication result from the multiplier 76 to the in-phase signal D_I, and outputs the calculation result D_I' to the amplitude correction generator 75 and the multiplier 78. Since the in-phase signal D_I and the angle-corrected in-phase signal D_I' have different amplitudes, the amplitude correction is performed by generating an amplitude correction coefficient β from the in-phase signal D_I' and the quadrature signal D_Q in the amplitude correction circuit 75. The amplitude correction coefficient β is multiplied by the in-phase signal D_I' in the multiplier 78. The multiplier 78 outputs the result as the in-phase signal D_Ical. The quadrature signal D_Qcal output by the IQ correction circuit 73 is substantially the same as the quadrature signal D_Q input to the IQ correction circuit 73.

Using the fifth embodiment configured as described above can reduce the rounding errors in the digital processing of drive axis signals having large amplitudes and reduce the finite word-length-effect of digital processing. As a result, a higher degree of accuracy may be achieved in the phase correction processing.

Sixth Embodiment

Figure 14:
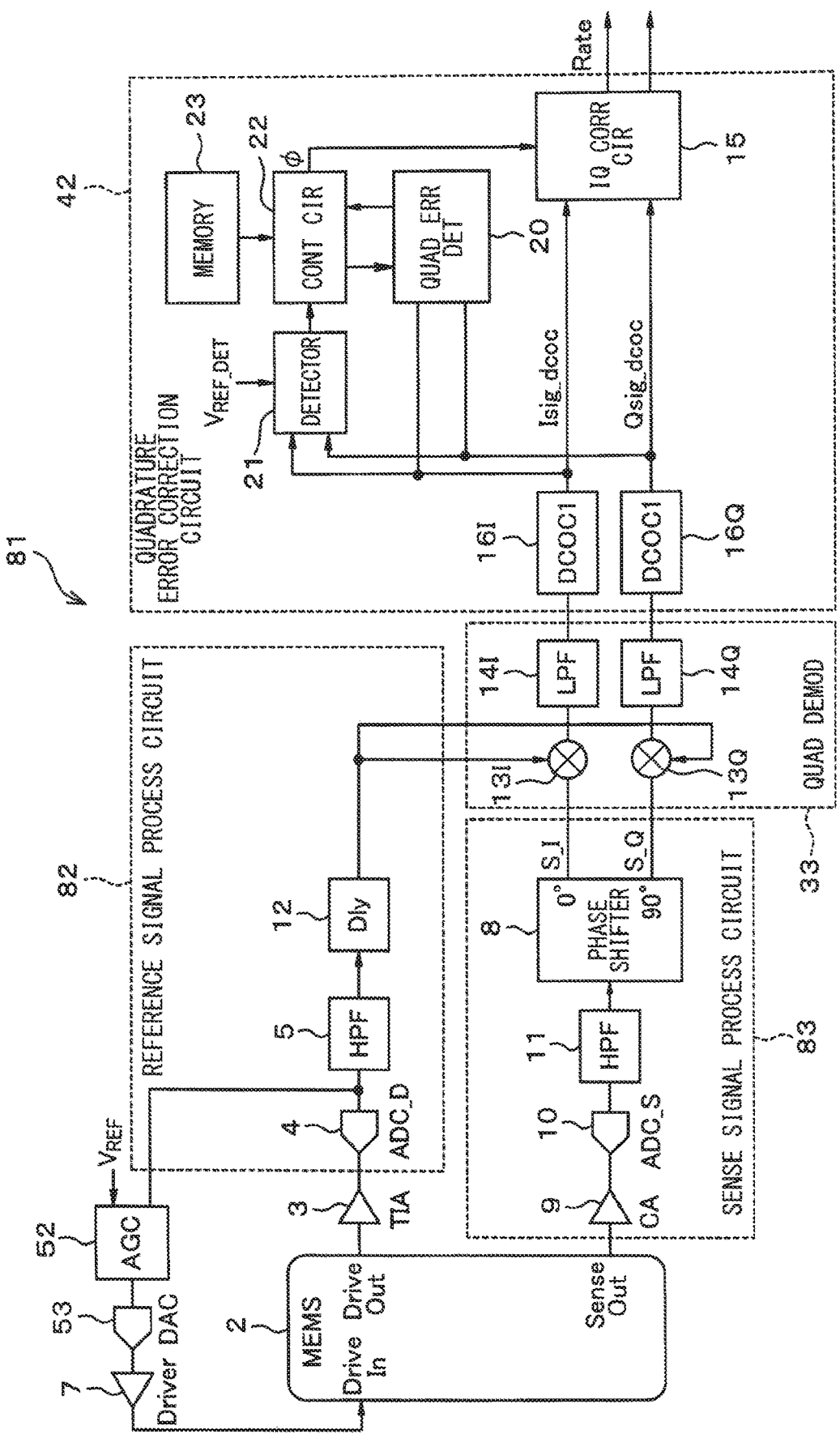
FIG. 14 illustrates a configuration of a vibration type gyroscope in a sixth embodiment of the present disclosure.

As shown in FIG. 14, a gyroscope 81 of the sixth embodiment is configured similarly to the gyroscope 51 in the third embodiment. In the sixth embodiment, the reference signal processing circuit 31 and the sense signal processing circuit 32 of the third embodiment are replaced with a reference signal processing circuit 82 and a sense signal processing circuit 83. The reference signal processing circuit 82 and the sense signal processing circuit 83 are configured such that the phase shifter 8 that is in the reference signal processing circuit 31 in the third embodiment is switched with the delay (Dly) circuit 12 of the sense signal processing circuit 32 in the third embodiment.

In other words, the sense signal processing circuit 83 has the phase shifter 8 disposed at a position on an output side of the high-pass filter (HPF) 11, and the phase shifter 8 outputs the in-phase signal S_I and the quadrature signal S_Q of the modulated sense signal to the quadrature demodulator 33. The reference signal processing circuit 82 has the Dly circuit 12 disposed at a position on an output side of the HPF 5, and outputs a drive signal having an added time delay to the quadrature demodulator 33.

By using the configuration in the above-described current embodiment, signal processing similar to the signal processing in the third embodiment can be performed. Since the noise superposed on the sense signal can be cancelled by the filtering characteristics of the HPF 11 and the phase shifter 8, by using the configuration of the current embodiment, the gyroscope 81 in the current embodiment can reduce signal noise and thus has low-noise characteristics.

Seventh Embodiment

Figure 15:
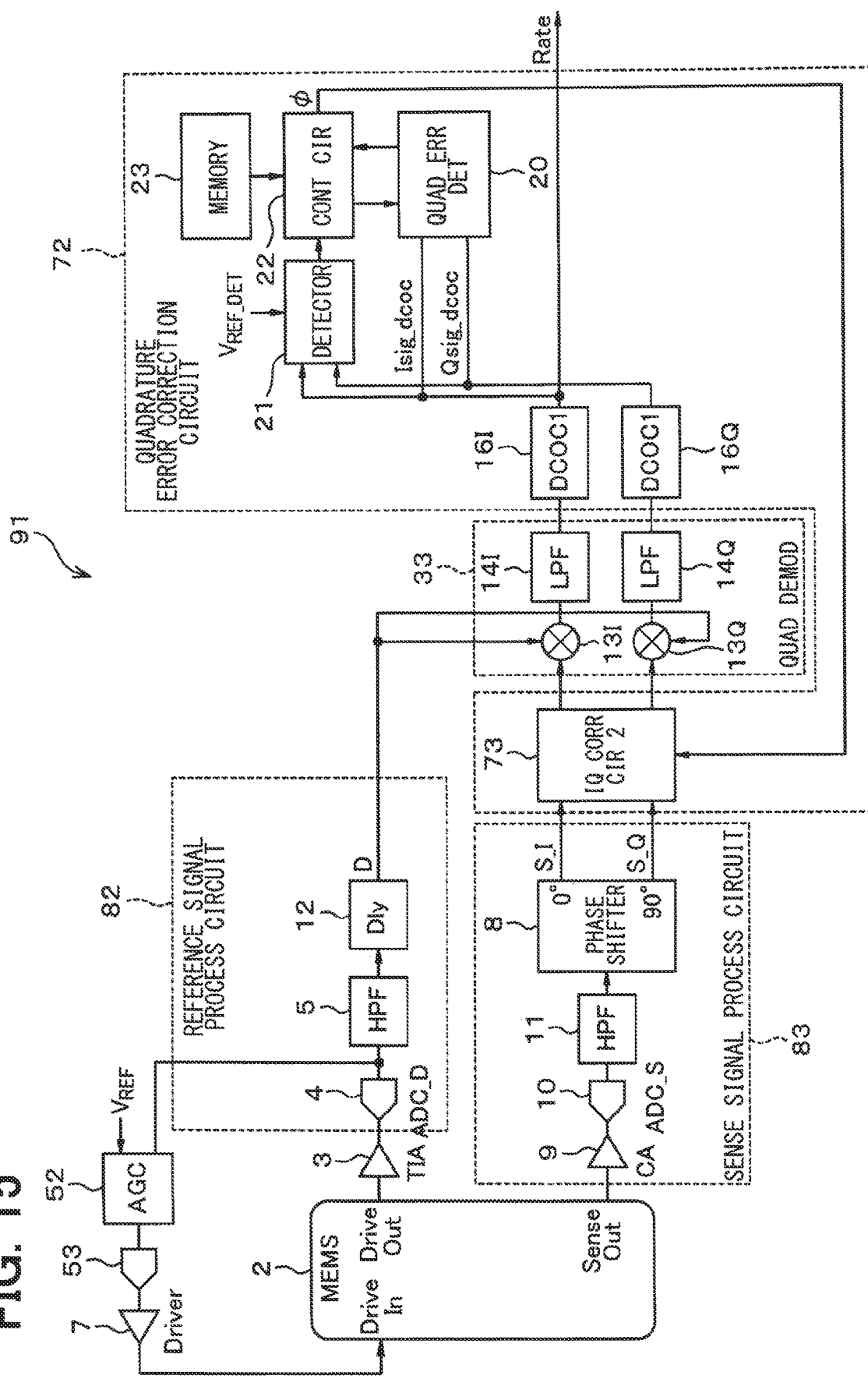
FIG. 15 illustrates a configuration of a vibration type gyroscope in a seventh embodiment of the present disclosure.

As shown in FIG. 15, a gyroscope 91 of the seventh embodiment is configured similarly to the gyroscope 81 in the sixth embodiment. In the current embodiment, the quadrature error correction circuit 42 of the sixth embodiment is replaced with the quadrature error correction circuit 72 of the fifth embodiment. As such, the in-phase signal S_I and the quadrature signal S_Q are output from the phase shifter 8 in the sense signal processing circuit 83 and are input to the IQ correction circuit 73, shown as "IQ CORR CIR 2" in FIG. 15, of the quadrature error correction circuit 72.

If the drive signal includes a harmonic component, signal noise from aliasing may be generated by the frequency conversion in the quadrature demodulator 33, and the signal-to-noise (S/N) ratio may become worse (i.e., deteriorate) in some cases. By using the above-described configuration of the current embodiment, or more specifically, by arranging the IQ correction circuit 73 in front of the quadrature demodulator 33, the quadrature error correction can be performed in a good S/N ratio state.

Other Embodiments

The resonator is not limited to a MEMS resonator. The quadrature error correction circuits in the previous embodiments may be configured so as to make the detector 21, the control circuit 22, and the memory 23 as optional elements. Specific numerical frequency values may be changed based on the design of the device/system. The embodiments may be combined with one another to make new embodiments where elements from each of the embodiments may be added and/or removed from the combined embodiment.

Although the present disclosure has been made in accordance with the respective embodiments, it is understood that the present disclosure is not limited to those embodiments and structures. The present disclosure covers various modification examples and equivalent arrangements.

What is claimed is:

1. A vibration type gyroscope comprising:
   a resonator having a drive signal input terminal for inputting an input drive signal, a drive signal output terminal for outputting an output drive signal, and a sense signal output terminal for outputting a modulated sense signal, the modulated sense signal modulated by the input drive signal based on an externally applied angular velocity;
   a quadrature demodulator configured to quadratically demodulate the modulated sense signal;
   a first offset canceller circuit configured to cancel a direct current offset component included in a demodulated in-phase signal of the sense signal;
   a second offset canceller circuit configured to cancel a direct current offset component included in a demodulated quadrature signal of the sense signal;
   an error detector configured to detect a quadrature error based on the demodulated in-phase signal of the sense signal input from the first offset canceller circuit and the demodulated quadrature signal of the sense signal input from the second offset canceller circuit, and to output an error signal; and
   a phase corrector configured to receive the demodulated in-phase signal of the sense signal and the demodulated quadrature signal of the sense signal as inputs, and to output a phase signal having a phase corresponding to the error signal.

2. The vibration type gyroscope of claim 1 further comprising:
   a phase shifter configured to generate an in-phase signal of the drive signal and a quadrature signal of the drive signal from the output drive signal, the in-phase signal of the drive signal and the quadrature signal of the drive signal having a 90 degree phase difference; and
   a third offset canceller circuit configured to cancel a direct current offset component from the phase signal output from the phase corrector, wherein
   the quadrature demodulator is further configured to demodulate the modulated sense signal by respectively multiplying the modulated sense signal with the in-phase signal of the drive signal and the quadrature signal of the drive signal, and to output the demodulated in-phase signal of the sense signal and the demodulated quadrature signal of the sense signal, and wherein
   the first offset canceller circuit, the second offset canceller circuit, and the phase corrector are each configured to receive the demodulated in-phase signal of the sense signal and the demodulated quadrature signal of the sense signal as inputs.

3. The vibration type gyroscope of claim 1 further comprising:
   a phase shifter configured to generate an in-phase signal and a quadrature signal from the output drive signal, the in-phase signal of the drive signal and the quadrature signal of the drive signal having a 90 degree phase difference, wherein
   the quadrature demodulator is further configured to demodulate the modulated sense signal by respectively multiplying the modulated sense signal with the in-phase signal of the drive signal and the quadrature signal of the drive signal and to output the demodulated in-phase signal of the sense signal and the demodulated quadrature signal of the sense signal, and wherein
   the first offset canceller circuit is further configured to receive the demodulated in-phase signal of the sense signal, and wherein
   the second offset canceller circuit is further configured to receive the demodulated quadrature signal of the sense signal, and wherein
   the phase corrector is further configured to receive the demodulated in-phase signal of the sense signal from the first offset canceller circuit and the demodulated quadrature signal of the sense signal from the second offset canceller circuit as inputs.

4. The vibration type gyroscope of claim 2, wherein the phase shifter is a Phase Locked Loop circuit.

5. The vibration type gyroscope of claim 1 further comprising:
   a phase shifter configured to generate an in-phase signal of the sense signal and a quadrature signal of the sense signal from the modulated sense signal output from the sense signal output terminal, the in-phase signal of the sense signal and the quadrature signal of the sense signal having a 90 degree phase difference, wherein
   the quadrature demodulator is further configured
   to demodulate the modulated sense signal by multiplying the in-phase signal of the modulated sense signal by the output drive signal and multiplying the quadrature signal of the modulated sense signal by the output drive signal, and
   to output the demodulated in-phase signal of the sense signal and the demodulated quadrature signal of the sense signal, and wherein
   the first offset canceller circuit is further configured to receive and input the demodulated in-phase signal of the sense signal, and wherein
   the second offset canceller circuit is further configured to receive and input the demodulated quadrature signal of the sense signal, and wherein
   the phase corrector is further configured to receive and input the demodulated in-phase signal of the sense signal from the first offset canceller circuit and the demodulated quadrature signal of the sense signal from the second offset canceller circuit.

6. The vibration type gyroscope of claim 1 further comprising:
   a phase shifter configured to generate a modulated in-phase signal and a modulated quadrature signal from the modulated sense signal that is output from the sense signal output terminal, the modulated in-phase signal and the modulated quadrature signal having a 90 degree phase difference, wherein the phase corrector is further configured to receive and the modulated in-phase signal and the modulated quadrature signal as inputs and to phase correct the modulated in-phase single and the modulated quadrature signal, and wherein the quadrature demodulator is further configured to receive the phase corrected modulated in-phase signal and the phase corrected modulated quadrature signal from the phase corrector, and wherein the first offset canceller circuit is configured to receive the phase corrected demodulated in-phase signal from the quadrature demodulator and to output an angular velocity signal, and wherein the second offset circuit is configured to receive the phase corrected demodulated quadrature signal from the quadrature demodulator.

7. The vibration type gyroscope of claim 1 further comprising:
a detector configured to
receive the demodulated in-phase signal of the sense signal from the first offset canceller circuit and demodulated the quadrature signal from the second offset canceller circuit,
calculate a signal power from the demodulated in-phase and quadrature signals of the sense signal,
compare the signal power with a preset threshold value, and
output a trigger signal when the signal power exceeds the preset threshold value; and
an average calculator configured to calculate an average of a plurality of error signals that are input from the error detector for a preset period of time in response to receiving the trigger signal, wherein
the phase corrector is further configured to receive the error signal as an input via the average calculator.

8. The vibration type gyroscope of claim 7 further comprising:
a memory configured to store an initial value of the error signal, wherein
the initial value of the error signal from the memory is input to the average calculator in response to the gyroscope beginning operation.

9. The vibration type gyroscope of claim 1 further comprising:
a drive-axis oscillation loop that loops from the drive signal output terminal of the resonator to the drive signal input terminal of the resonator, the drive-axis oscillation loop having:
an analog-to-digital converter;
a gain controller circuit configured to auto-adjust a gain of the output drive signal by digital processing; and
a digital-to-analog converter.

10. A vibration type gyroscope comprising:
a resonator having a drive signal input terminal that inputs an input drive signal, a drive signal output terminal that outputs an output drive signal, and a sense signal output terminal that outputs a modulated sense signal that is modulated by the input drive signal based on an angular velocity;
a phase shifter configured to generate an in-phase signal of the drive signal and a quadrature signal of the drive signal from the output drive signal, the in-phase signal of the drive signal and the quadrature signal of the drive signal respectively having a 90 degree phase difference from each other;
a quadrature phase corrector configured to receive the in-phase signal of the drive signal, the quadrature signal of the drive signal, and an error signal as inputs, to correct the in-phase signal of the drive signal and the quadrature signal of the drive signal based on the error signal, and to output a corrected in-phase signal of the drive signal and a corrected quadrature signal of the drive signal;
a quadrature demodulator configured to output a demodulated in-phase signal of the sense signal and a demodulated quadrature signal of the sense signal by respectively multiplying the modulated sense signal by the corrected in-phase signal of the drive signal and the corrected quadrature signal of the drive signal;
a first offset canceller circuit configured to receive the demodulated in-phase signal of the sense signal as an input and to cancel a direct current offset component from the in-phase signal of the sense signal;
a second offset canceller circuit configured to receive the demodulated quadrature signal of the sense signal as an input and to cancel a direct current offset component from the quadrature signal of the sense signal; and
an error detector configured to detect a quadrature error based on the demodulated in-phase signal of the sense signal input from first offset canceller circuit and the demodulated quadrature signal of the sense signal input from the second offset canceller circuit, and to output the error signal, wherein
the first offset canceller circuit is further configured to output an angular velocity signal.

11. The vibration type gyroscope of claim 10 further comprising:
a detector configured to
receive the demodulated in-phase signal of the sense signal from the first offset canceller circuit and the demodulated quadrature signal of the sense signal from the second offset canceller circuit,
calculate a signal power from the demodulated in-phase signal of the sense signal and the demodulated quadrature signals of the sense signal,
compare the signal power with a preset threshold value, and
output a trigger signal when the signal power exceeds the preset threshold value; and
an average calculator configured to calculate an average of a plurality of error signals that are input from the error detector for a preset period of time in response to receiving the trigger signal, wherein
the quadrature phase corrector is further configured to receive the error signal as an input via the average calculator.

* * * * *